United States Patent [19]
Chen et al.

[11] Patent Number: 5,212,704
[45] Date of Patent: May 18, 1993

[54] ARTICLE COMPRISING A STRAINED LAYER QUANTUM WELL LASER

[75] Inventors: Young-Kai Chen, Berkeley Heights; Maurice A. Chin, South Plainfield; Jenn-Ming Kuo, Edison; Arthur M. Sergent, New Providence; Ming-Chiang Wu, Bridgewater, all of N.J.

[73] Assignee: AT&T Bell Laboratories, Murray Hill, N.J.

[21] Appl. No.: 800,772

[22] Filed: Nov. 27, 1991

[51] Int. Cl.$^5$ .............................................. H01S 3/19
[52] U.S. Cl. ......................................... 372/46; 372/45
[58] Field of Search .................................. 372/45, 46

[56] References Cited

U.S. PATENT DOCUMENTS 4,881,235  11/1989  Chinone et al. ....................... 322/46

OTHER PUBLICATIONS

"High-Power 0.98 μm GaInAs Strained Quantum Well Lasers for Er$^{3+}$-Doped Fibre Amplifier", by M. Okayasu et al., Electronics Letters, vol. 25, No. 23, Nov. 9, 1989, pp. 1563-1564.

"InGaAs/AlGaAs Strained Single Quantum Well Diode Lasers With Extremely Low Threshold Current Density And High Efficiency", by H. K. Choi et al., Applied Physics Letters, vol. 57 (4), Jul. 23, 1990, pp. 321-323.

"AlGaAs/GaAs Self-Aligned LD's Fabricated by the Process Containing Vapor Phase Etching and Subsequent MOVPE Regrowth", by M. Nido et al., IEEE Journal of Quantum Electronics, vol. QE-23, No. 6, Jun. 1987, pp. 720-724.

"Single-Longitudinal-Mode Selfaligned (AlGa)As Double-Heterostructure Lasers Fabricated by Molecular Beam Epitaxy", by H. Tanaka et al., Japanese Journal of Applied Physics, vol. 24, No. 2, Feb. 1985, pp. L89-L90.

"MBE as a Production Technology for AlGaAs Lasers", by H. Tanaka et al., Journal of Crystal Growth, vol. 111, (1991), pp. 1043-1046.

"GaInP Mass Transport and GaInP/GaAs Buried-Heterostructure Lasers", by S. H. Groves et al., Applied Physics Letters, vol. 56(4), Jan. 22, 1990, pp. 312-314.

"High Power CW Operation of Aluminum-Free InGaAs/GaAs/InGaP Strained Layer Single Quantum Well Ridge Waveguide Lasers", by T. Ijichi et al., Furukawa Electric Corporation, Yokohama 220, Japan, pp. 44-45.

"Transverse-Mode Stabilized GaAlAs Laser With an Embedded Confining Layer on Optical Guide by MOCVD", by M. Okajima et al., Toshiba Research and Development Center, Toshiba Corp., Kawasaki 210, Japan, 1983 IEEE, pp. 292-295.

"Self-aligned Structure InGaAsP/InP DH Lasers", by H. Nishi et al., Applied Physics Letters, vol. 35(3), Aug. 1, 1979, pp. 232-234.

"Long-Term 60 mW Operation of 780 nm AlGaAs Lasers With Extended Beam by Additional Low-Al-Content Layer in p-Type Cladding Layer", by S. Nakatsuka, Electronic Letters, vol. 27, No. 11, May 23, 1991, pp. 900-902.

Primary Examiner—James W. Davie
Attorney, Agent, or Firm—Eugen E. Pacher

[57] ABSTRACT

A GaAs-based self-aligned laser with emission wavelength in the approximate wavelength regime 0.87-1.1 μm is disclosed. The laser is a strained layer QW laser and is readily manufacturable. Preferred embodiments of the inventive laser do not comprise Al-containing semiconductor alloy. Lasers according to the invention can for instance be used advantageously as 0.98 μm pump sources for Er-doped fiber amplifiers.

8 Claims, 4 Drawing Sheets

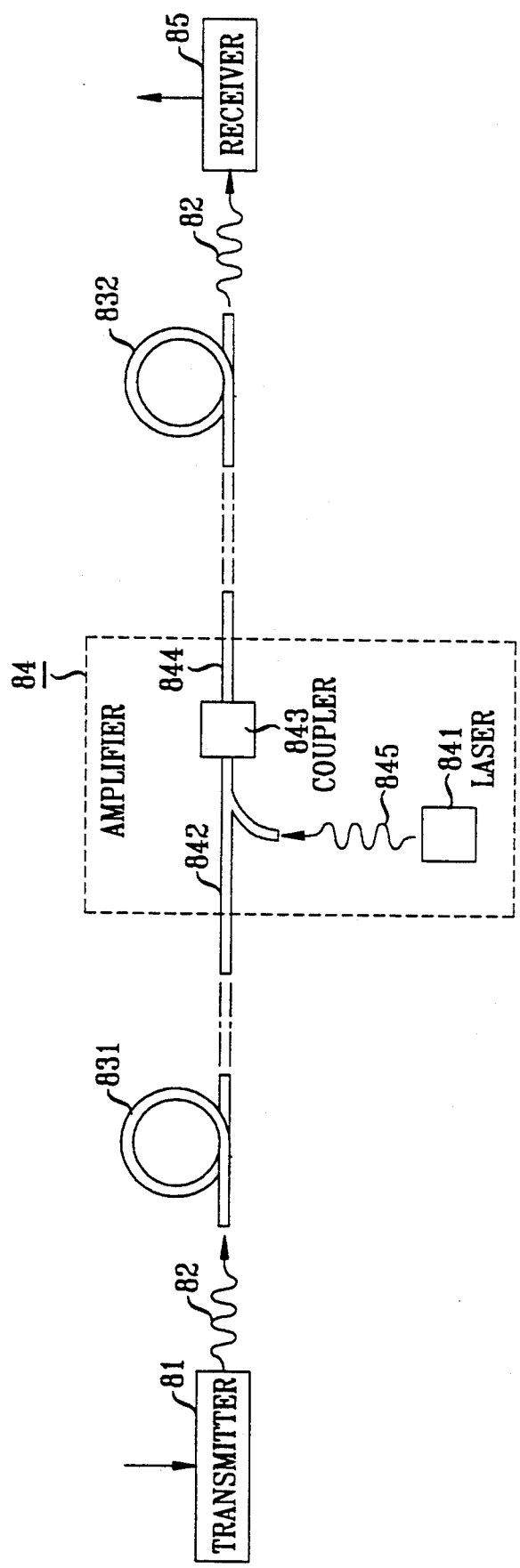

ARTICLE COMPRISING A STRAINED LAYER QUANTUM WELL LASER

FIELD OF THE INVENTION

This invention pertains to strained-layer quantum well (QW) semiconductor lasers, and to articles that comprise such lasers.

BACKGROUND OF THE INVENTION

Due at least in part to the discovery that Er-doped silica optical fiber amplifiers are advantageously pumped with 0.98 μm radiation, and that it would be advantageous to pump Pr-based fluoride fiber amplifiers with radiation of about 1.01 μm wavelength, there is now considerable commercial interest in radiation sources for the approximate 0.87-1.1 μm wavelength regime.

For practical reasons pump lasers for optical fiber amplifiers almost invariably will be semiconductor lasers. It is well known that InP-based lasers can have emission wavelengths $\geq 0.94$ μm. However, InP-based lasers that have wavelengths in the short-wavelength portion (typically $\leq 1$ μm) of the wavelength regime accessible to such lasers, typically have some disadvantageous features that make such lasers a poor choice for applications such as optical fiber amplifiers with pump radiation in the range 0.94 μm to about 1 μm. For instance, InP-based lasers that emit in that wavelength range typically have high threshold current and low quantum efficiency, due to their inherently low bandgap difference between InP and the relevant quaternary or ternary semiconductor alloy. On the other hand, the bandgap difference between GaAs and the relevant alloy is relatively large, making possible design of GaAs-based lasers having advantageous properties, e.g., relatively low threshold current and relatively small temperature dependence. Thus, it would be highly desirable to have available a GaAs-based semiconductor laser that can emit at a predetermined wavelength in the approximate wavelength regime 0.87-1.1 μm.

However, as is well known, the bandgaps of GaAs and the relevant alloys are such that all GaAs-based lattice matched lasers will have an emission wavelength that is $\leq 0.87$ μm.

GaAs-based strained layer QW lasers that emit in the 0.87-1.1 μm wavelength regime are known. See, for instance, M. Okayasu et al., *Electronics Letters*, Vol. 25(23), p. 1563 (1989); H. K. Choi et al., *Applied Physics Letters*, Vol. 57(4), p. 321 (1990). However, these prior art lasers are ridge waveguide, buried heterostructure, capped heterostructure, or other difficult to manufacture (typically index-guided) structures that typically require one or more critical alignment steps during their manufacture. A further manufacturing problem associated with many of these prior art lasers is the use of Al-containing semiconductor material. It is well known to those skilled in the art that Al-containing semiconductor alloys have a strong tendency to oxidize, necessitating, for instance, oxide-removal steps prior to regrowth. This is a particular problem when using molecular beam epitaxy (MBE), an otherwise very advantageous growth method.

A laser having a self-aligned structure is typically more easily manufactured than one that is not self-aligned, and self-aligned lasers are known. See, for instance, M. Nido et al., *IEEE Journal of Quantum Electronics*, Vol. QE-23(6), p. 720 (1987); H. Tanaka et al., *Japanese Journal of Applied Physics*, Vol. 24(2), p. L89 (1985); and H. Tanaka et al., *Journal of Crystal Growth*, Vol. III p. 1043 (1991). Prior art GaAs-based self-aligned lasers have bulk current blocking layers that are lattice matched to the substrate, and their emission wavelength consequently is determined solely by the bandgap energy of the active layer material. It is for this reason that such lasers cannot be designed to emit in the above referred-to wavelength regime, since there are no suitable GaAs-based alloys that have $E_g$ corresponding to a wavelength in that regime. Furthermore, the prior art GaAs-based self-aligned lasers typically involve Al-containing semiconductor alloy, and thus require special steps during manufacture. For instance, H. Tanaka et al. (op. cit.) disclose a manufacturing process that comprises chemically patterning and thinning a GaAs layer such that only a 100 nm thick passivation layer remains, followed by thermal desorption of the passivation layer just before the start of the second epitaxial growth cycle.

In view of the above discussion it is evident that it would be highly desirable to have available a GaAs-based, self-aligned (and thus readily manufacturable) semiconductor laser whose emission wavelength is in the approximate range 0.87-1.1 μm. This application discloses such a laser.

GLOSSARY AND DEFINITIONS

A "quantum well" herein is a thin semiconductor layer of first composition and thickness t, sandwiched between semiconductor material of a second composition, with the compositions selected such that the relevant bandgap energy $E_{g1}$ of the first composition is less than the bandgap energy $E_{g2}$ of the second composition, and t furthermore is selected such that free carriers in the quantum well exhibit quantum effects, e.g., the lowest energy level associated with the well does not coincide with the relevant band edge of the well material. Typically, t is less than about 30 nm.

The "bandgap energy" associated with a semiconductor region herein is the minimum energy change associated with a transition between the valence band and the conduction band of the material. If a semiconductor region comprises a QW, then the bandgap energy associated with the region herein is the minimum energy change associated with a transition between an energy level associated with the valence band and an energy level associated with the conduction band.

A laser structure herein is "self-aligned" if the laser can be made, without a critical alignment step, to simultaneously confine both the charge carriers and the radiation field.

SUMMARY OF THE INVENTION

In a broad aspect the invention is an article that comprises a GaAs-based strained layer QW laser having a self-aligned structure and adapted for emission of radiation of predetermined wavelength λ in the approximate wavelength regime 0.87-1.1 μm. At least some embodiments of the invention comprise lasers that are free of Al-containing semiconductor material and that therefore are relatively easily grown by MBE.

More particularly, a laser according to the invention comprises a GaAs substrate, a multiplicity of epitaxial semiconductor layers on the substrate, and first and second contact means that facilitate flowing an electrical current between the contact means. The multiplicity of semiconductor layers comprises a first semiconductor layer doped to exhibit a first conductivity type, a second semiconductor layer that is undoped (not intentionally doped), a third semiconductor layer doped to exhibit a second conductivity type, and a patterned fourth semiconductor layer, with at least a part of the fourth layer material doped such that the fourth layer exhibits conductivity of the first conductivity type. Without intending thereby any limitation, the first-fourth semiconductor layers will frequently be referred to as "first cladding layer", "active layer", "second cladding layer", and "blocking layer". It will be understood that the n-th and (n+1)th layers (n=1,2,3) are not necessarily in direct contact with each other.

The fourth (blocking) layer is patterned to define an aperture (window) in the blocking layer, the window being adapted to facilitate, under normal laser operating conditions (forward bias), flow of charge carriers from a contact region through the second cladding layer into the active layer. The blocking layer is furthermore adapted to substantially prevent, under the same normal operating conditions, flow of charge carriers from the contact region through the blocking layer material into the second cladding layer.

Significantly, the inventive GaAs-based self-aligned laser emits radiation of a predetermined wavelength in the approximate wavelength regime 0.87-1.1 µm, and the active layer comprises at least one QW, of thickness less than a critical thickness $t_c$ associated with dislocation formation, the QW sandwiched between two barrier layers, with the QW composition selected such that the equilibrium lattice constant associated with the composition differs from the equilibrium lattice constant associated with the barrier layer material. The compositions of the various layers advantageously are chosen such that, inter alia, the bandgap energies of the relevant layers (with the possible exception of that of the blocking layer) are greater than the bandgap energy of the active layer.

Exemplarily, lasers according to the invention comprise a GaAs substrate, with $In_xGa_{1-x}As$, $In_yGa_{1-y}P$ (frequently referred to as "InGaAs" and "InGaP", respectively) and GaAs epitaxial layers thereon. As is well known, InGaAs is never lattice matched to GaAs (requiring that layer thickness be limited, to avoid dislocation formation), and InGaP is lattice matched to GaAs for y=0.49.

Exemplary of articles according to the invention is an optical fiber amplifier that comprises a 0.98 µm pump laser according to the invention.

BRIEF DESCRIPTION OF THE DRAWINGS

FIG. 8 schematically depicts an exemplary article according to the invention, namely, an optical fiber transmission system with a fiber amplifier that comprises a pump laser according to the invention.

DETAILED DESCRIPTION OF SOME PREFERRED EMBODIMENTS

Figure 1:
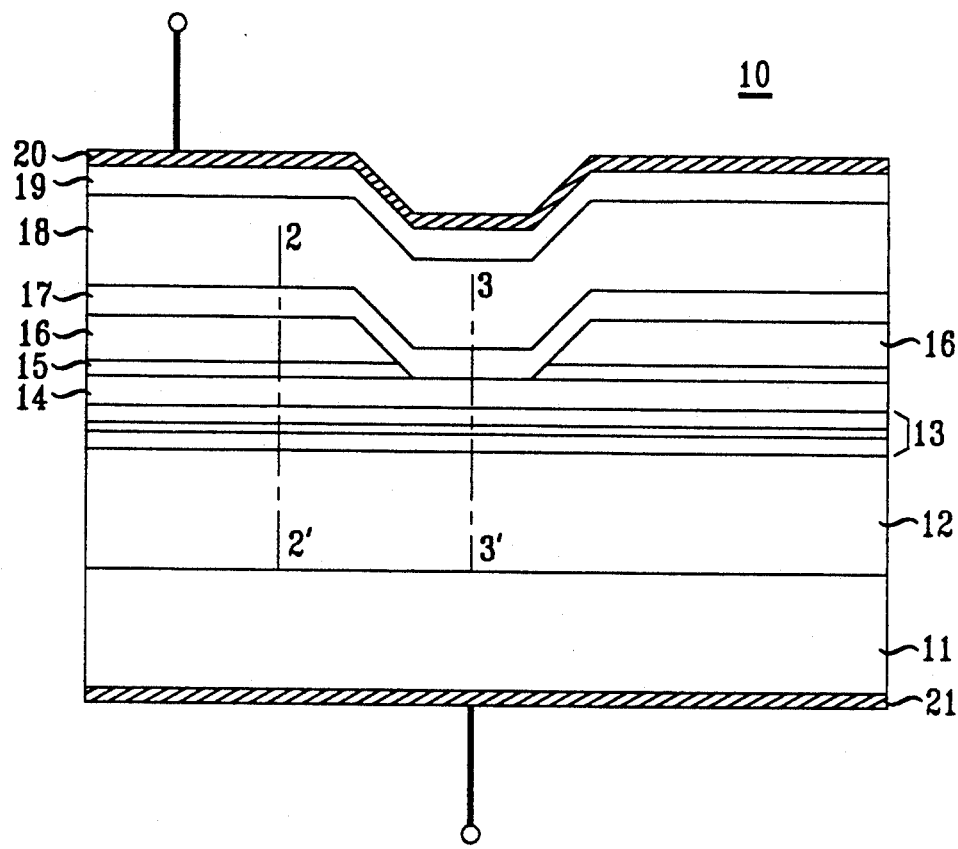
FIGS. 1 and 4 schematically depict two exemplary lasers according to the invention.

An exemplary embodiment 10 of the invention is schematically depicted in FIG. 1. Numeral 11 refers to the semiconductor substrate (exemplarily n+GaAs), 12 to the first cladding layer (exemplarily n InGaP), and 13 to the active layer (comprising one or more strained QW layers). Furthermore, numeral 14 refers to the second cladding layer (exemplarily p InGaP), 15 to an optional stop-etch layer (exemplarily p GaAs), 16 to the patterned blocking layer (exemplarily n InGaP), 17 to an optional waveguiding layer (exemplarily p GaAs), 18 to still another cladding layer (exemplarily p InGaP), 19 to a cap layer (exemplarily p+GaAs), and 20 and 21 to conventional metal contact layers (exemplarily respectively AuBe/Ti/Au and Au/Sn/Au). It will be understood that FIG. 1 does not necessarily show every layer that may desirably be incorporated into an actual device. Instead, FIG. 1 shows those features that are required to understand the operative principle of the exemplary embodiment.

Figure 2:
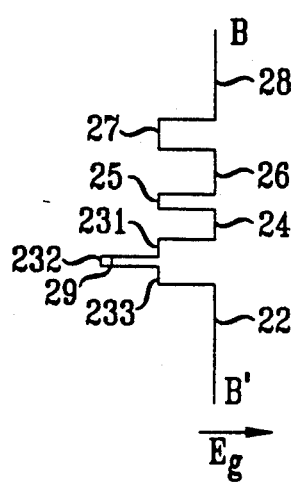
FIGS. 2 and 3 schematically show the conduction band edges associated with sections 2—2' and 3—3' of FIG. 1.
Figure 3:
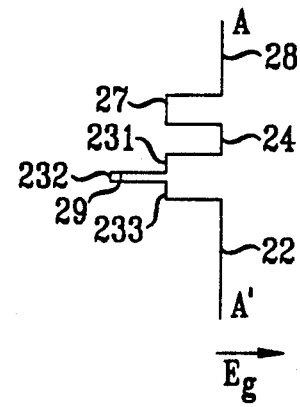

FIGS. 3 and 2 show in conventional form the conduction band edges associated with the exemplary embodiment of FIG. 1, along lines 3—3' and 2—2', respectively. Numeral 28 refers to the conduction band edge of cladding 18, 27 to that of waveguide layer 17, 26 to that of blocking layer 16, 25 to that of stop-etch layer 15, and 24 to that of cladding layer 14. Furthermore, numerals 231 and 233 refer to the conduction band edge of the barrier layers, and 232 to that of the QW sandwiched between the barrier layers. Numeral 29 refers to the lowest bound energy level associated with the QW. For simplicity's sake only one QW is shown. Finally, numeral 22 refers to the conduction band edge of cladding layer 12. The corresponding valence band edges are not shown but can be readily drawn for any appropriate combination of materials.

As can be seen, the exemplary embodiment of FIG. 1 comprises a blocking layer 16 whose bandgap energy $E_g$ is greater than that associated with the active region. Furthermore, since $E_g$ of the blocking layer 16 is less than or equal to $E_g$ of cladding layer 18 (and therefore in general the refractive index of 16 is greater than or equal to that of 18), lateral waveguiding is provided by waveguide layer 17.

Those skilled in the art will recognize that it is possible to select the composition of the blocking layer 16 such that the blocking layer material has $E_g$ greater than that of cladding layer 18 (and consequently the refractive index of 16 is less than that of 18). In this case waveguide layer 17 is optional, since such a structure would exhibit lateral guiding even without the waveguide layer.

Figure 4:
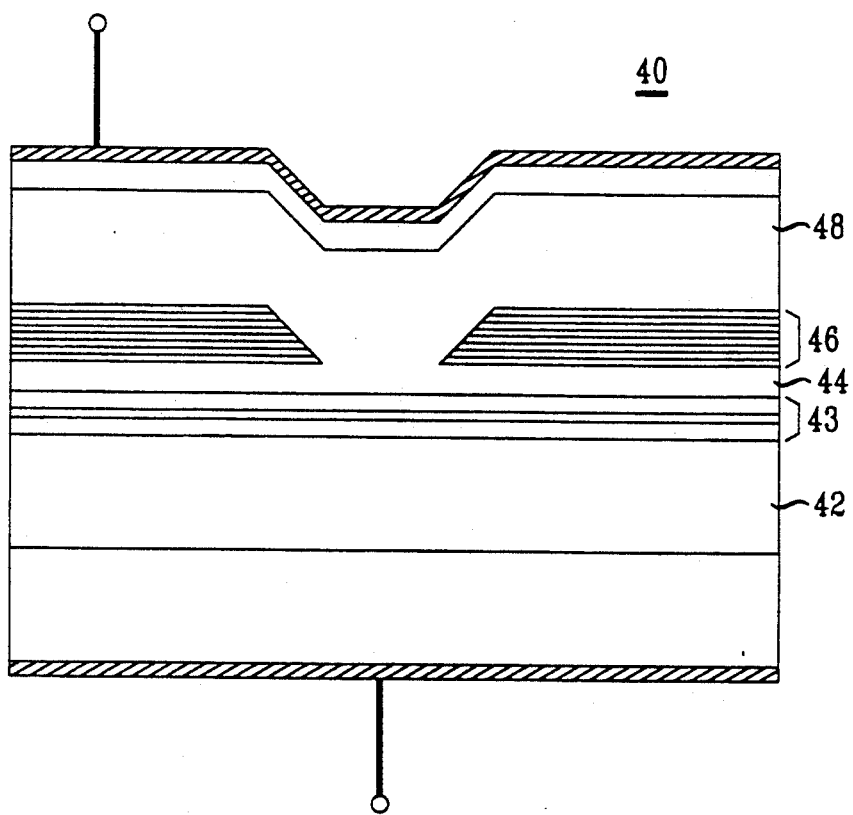

A further embodiment 40 of the invention is schematically depicted in FIG. 4. The laser comprises cladding layer 42 (exemplarily n InGaP), active layer 43 (exemplarily as described above, with the composition of the active layer QW being $In_xGa_{1-x}As$; exemplarily x=0.2), cladding 44 and 48 (exemplarily p InGaP), and blocking layer 46. The blocking layer comprises a multiplicity of QWs. The composition of the QW material and/or the thickness of the QWs are selected such that the QWs can absorb radiation generated in the active region. Exemplarily this is achieved if the blocking layer QWs are of composition $In_yGa_{1-y}As$, with $y \geq x$ (exemplarily, y=0.25), assuming that the blocking layer QWs have the same thickness as the active region QW or QWs.

As those skilled in the art will recognize, the instant embodiment of the invention involves lateral radiation confinement through absorption. The relative amount of absorption depends on, e.g., the distance between 43 and 46, and the number and thickness of blocking layer QWs. Typically the thickness of blocking layer 46 is at least 0.1 μm, since a significantly thinner blocking layer may be subject to electrical break-down or excessive leakage. The thicknesses of all the QWs of course are selected such that they are below the respective (known) critical thicknesses, in order to insure a dislocation-free structure.

A laser substantially as shown by FIG. 1 was made as follows. On a (100)n+ GaAs wafer was grown in sequence by gas source MBE a 0.2 μm buffer layer consisting of a lattice matched superlattice (10 pairs n+ InGaP/GaAs; each layer being 10 nm thick), a 1.5 μm n+ InGaP cladding layer, a 0.1 μm GaAs separate confinement heterostructure (SCH) layer, three 7 nm $In_{0.2}Ga_{0.8}As$ strained QW layers separated by 20 nm GaAs barrier layers, a 0.1 μm GaAs SCH layer, a 0.1 μm p+ InGaP barrier layer, a 10 nm p+ GaAs stop-etch layer, and a 0.2 μm n+ InGaP blocking layer. The combination of SCH layer/3 QWs/SCH layer corresponds to active layer 13 in FIG. 1.

After completion of the above first growth, the wafer was patterned with $SiO_2$ window stripes of various widths, aligned along the $<1\bar{1}0>$ crystal direction to provide positive slopes after etching. Channels were delineated by removing the elongate exposed portions of the n+ InGaP blocking layer by selective wet chemical etching with 3:1 $HCl/H_2O$. Subsequently the $SiO_2$ etch mask and the exposed portion of the n+ GaAs stop-etch layer were removed by conventional means, and the wafer was re-loaded into the growth chamber for the second growth sequence.

It will be noticed that at this point in the processing the relevant wafer surface is all InGaP. This is a very advantageous condition, which helps to avoid potential problems that could occur if GaAs were exposed. As is known, GaAs is unstable in the P-flux during the necessary initial in-situ high temperature removal of surface oxide.

The second growth consisted of GSMBE growth of a 0.1 μm p+ GaAs waveguide layer, a 1.0 μm p+ InGaP cladding layer, and a 0.2 μm p+ GaAs cap layer. Unless otherwise noted, all InGaP layers had the $In_{0.49}Ga_{0.51}P$ lattice matched composition. Growth was at 520° C., n-type material was doped with Si, and p-type material with Be.

After completion of the second growth sequence, the wafer was thinned to about 0.1 mm and conventionally alloyed with AuBe/Ti/Au and Au/Sn/Au as p-and n-type metal contact layers, respectively. Then the wafer was cleaved into bodies of approximate dimensions 0.5 mm by 0.5 mm, the facets were coated in conventional manner, and the thus produced lasers were mounted, junction side up, on Cu heat sinks. Any processing steps not explicitly recited were conventional and well known.

Figure 5:
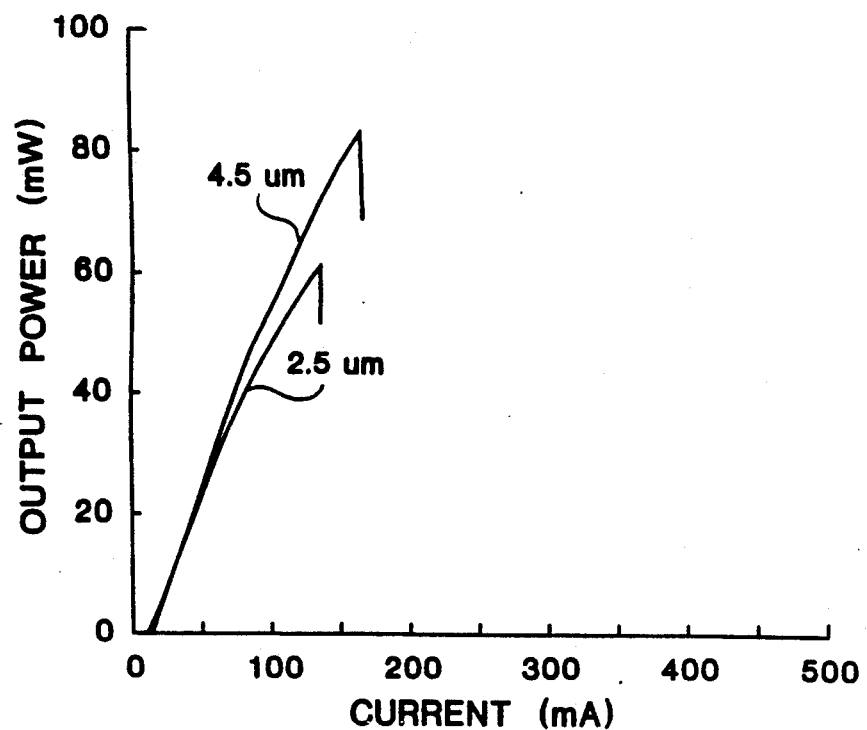
FIGS. 5 and 7 show exemplary output power vs. drive current data.

FIG. 5 shows exemplary CW room temperature data, for AR/HR coated lasers (produced as described above) with, respectively, 2.5 and 4.5 μm wide openings in the blocking layer. The lasers exhibited threshold currents of 12 and 14 mA, respectively, an external differential quantum efficiency of 0.68 mW/mA, and a peak power emitted into free space of 61 and 83 mW, respectively.

Figure 6:
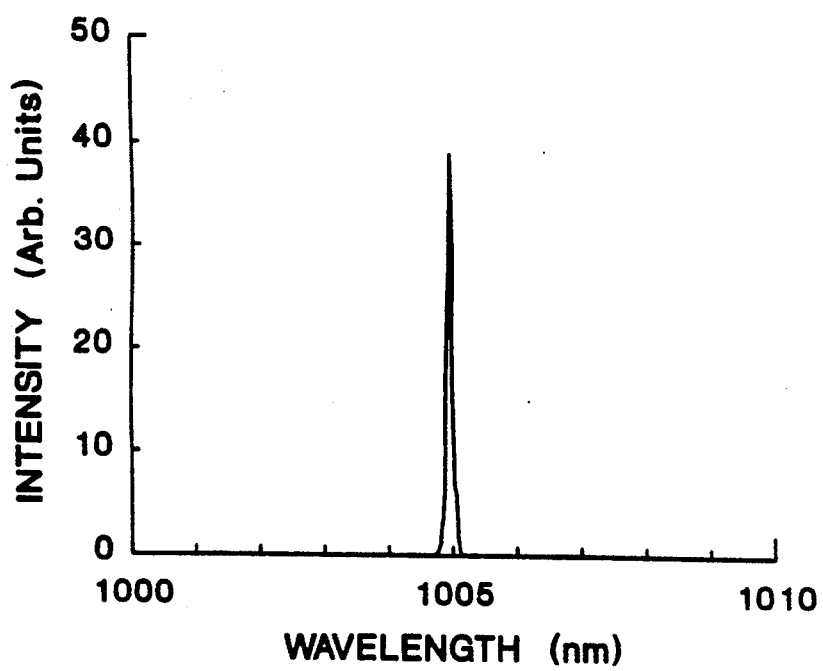
FIG. 6 presents exemplary output intensity vs. wavelength data.

FIG. 6 shows exemplary data of emission intensity vs. wavelength of a laser, made as described above, with 2.5 μm blocking layer opening. The room temperature CW data was taken at 30 mW output power, and clearly shows that the emission is single mode, centered at 1.005 μm wavelength, with side mode suppression ratio of more than 30 db. Fundamental mode lasing typically was observed up to the highest output powers. Those skilled in the art will appreciate that only minor changes in composition and/or QW thickness would be required to result in a laser whose output is centered at 0.98 μm.

Figure 7:
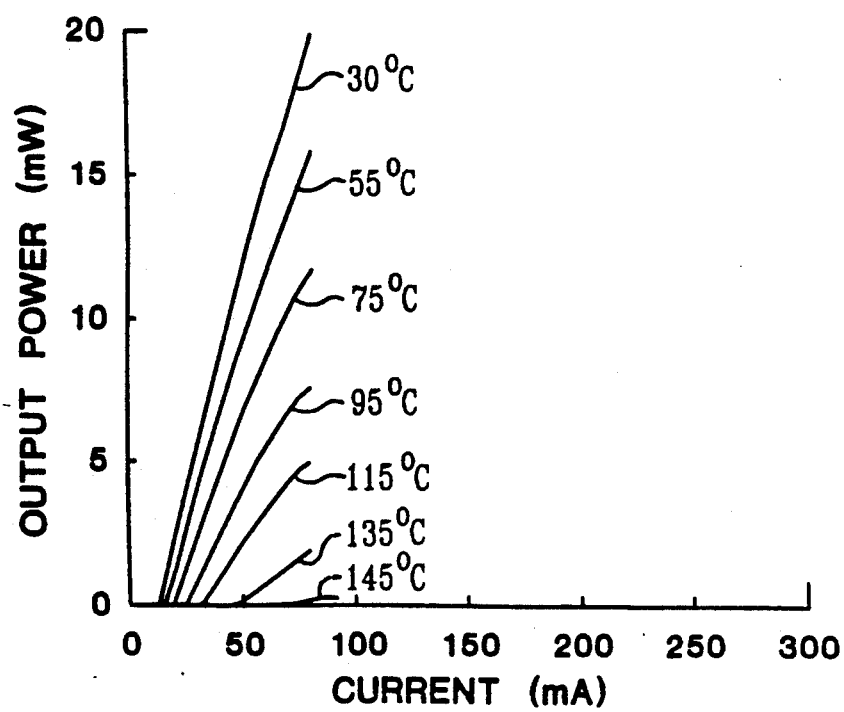

FIG. 7 shows exemplary data on output power vs. drive current, for temperatures from 30° to 145° C., for a 2.5 μm opening width lasers produced as described above. The laser exhibited a critical temperature ($T_0$) of 130K. From measurements on lasers of varying cavity length, an estimated typical internal differential quantum efficiency of about 82% and a typical waveguide loss of about 12 $cm^{-1}$ were obtained.

The above discussed specific embodiments are free of Al-containing semiconductor alloy. Such embodiments are preferred, but the invention is not so limited. For instance, a further embodiment has a structure as shown in FIG. 1, except that claddings 12 and 14 are n $Al_{0.4}Ga_{0.6}As$, stop-etch layer 15 is p AlAs, and blocking layer 16 and cladding 18 are p $Al_{0.4}Ga_{0.6}As$.

FIG. 8 schematically depicts an exemplary article according to the invention, namely, optical fiber communication system 80 that comprises optical amplifier means 84. Modulated radiation 82 (e.g., of approximate wavelength 1.55 μm) is produced by transmitter 81 in response to an external signal and is coupled into optical transmission fiber 831, is transmitted therethrough to amplifier 84, is amplified, continues on through further transmission fiber 832 to receiver 85, where an output signal is produced in response to the received optical signal. The amplifier 84 comprises a conventional wavelength division multiplexed (WDM) coupler connected, by conventional connection means 843, to a length of Er-doped optical fiber 844. Pump radiation 845 of approximate wavelength 0.98 μm is produced by inventive laser 841 and is coupled into the pump arm of the WDM coupler 842 and co-propagates with the signal radiation in the Er-doped fiber, resulting in amplification of the signal. Those skilled in the art will appreciate that optical fiber communication systems can be bi-directional, and that pump radiation can be co- as well as counter-propagating with the signal radiation. A variety of conventional components (e.g., means for providing a drive current to pump laser 841) are not shown in FIG. 8.

We claim:

1. An article comprising a GaAs-based self-aligned semiconductor laser adapted for emission of electromagnetic radiation of wavelength λ, said laser comprising a semiconductor substrate, a multiplicity of epitaxial semiconductor layers on said substrate, and first and second contact means for flowing a current between said contact means, said multiplicity of semiconductor layers comprising, in sequence, a first semiconductor layer (to be referred-to as the "first cladding layer") doped to exhibit a first conductivity type, a second semiconductor layer (to be referred-to as the "active layer") that is substantially undoped, a third semiconductor layer (to be referred-to as the "second cladding layer") doped to exhibit a second conductivity type, and a patterned fourth semiconductor layer (to be referred-to as the "blocking layer"), at least a part of said blocking layer material being doped to exhibit conductivity of said first conductivity type, said blocking layer being patterned to define a window adapted to facilitate, under forward bias laser operating conditions, flow of charge carriers from a contact region through said second cladding layer into said active layer, said blocking layer adapted to substantially prevent, under said forward bias laser operating conditions, flow of charge carriers through said blocking layer material into said second cladding; characterized in that a) $0.87 \ \mu m < \lambda \lesssim 1.1 \ \mu m$; and b) said active layer comprises at least one quantum well, of thickness t less than a critical thickness $t_c$ associated with dislocation formation, sandwiched between two barrier layers, associated with the material of each of said quantum well and barrier layers being an equilibrium lattice constant, with said quantum well material selected such that said equilibrium lattice constant associated with said quantum well material differs from said equilibrium lattice constant associated with said barrier layer material.

2. Article according to claim 1, wherein the compositions of said blocking layer and said active layer are selected such that the bandgap energy ($E_{g4}$) associated with said blocking layer is greater than the bandgap energy ($E_{g2}$) associated with said active layer.

3. Article according to claim 2, wherein $E_{g4}$ is less than or equal to the bandgap energy ($E_{g3}$) associated with said second cladding layer, and wherein said multiplicity of semiconductor layers comprises a fifth semiconductor layer (to be referred to as the "waveguide layer"), with at least a portion of said waveguide layer contacting said second cladding layer in said window in said blocking layer, the composition of said waveguide layer selected such that the bandgap energy ($E_{g5}$) associated with said waveguide layer meets the condition $E_{g2} < E_{g5} < E_{g4}$.

4. Article according to claim 2, wherein $E_{g4}$ is greater than $E_{g3}$.

5. Article of claim 1, wherein the respective compositions of said blocking layer and said active layer are selected such that said bandgap energy ($E_{g4}$) associated with said blocking layer is less than said bandgap energy ($E_{g2}$) associated with said active layer.

6. Article of claim 5, wherein said blocking layer comprises a multiplicity of quantum wells.

7. Article of claim 1, wherein said substrate is GaAs and said multiplicity of layers are essentially Al-free.

8. Article of claim 1, wherein said first conductivity type is n-type conductivity, wherein t is at most 30 nm, and wherein the thickness of said blocking layer is at least 0.1 $\mu m$.

* * * * *